(12) United States Patent
Arnold et al.

(10) Patent No.: US 8,298,954 B1
(45) Date of Patent: Oct. 30, 2012

(54) SIDEWALL IMAGE TRANSFER PROCESS EMPLOYING A CAP MATERIAL LAYER FOR A METAL NITRIDE LAYER

(75) Inventors: John C. Arnold, Valatie, NY (US); Sean D. Burns, Hopewell Junction, NY (US); Matthew E. Colburn, Schenectady, NY (US); David V. Horak, Essex Junction, VT (US); Yunpeng Yin, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 5 days.

(21) Appl. No.: 13/102,224

(22) Filed: May 6, 2011

(51) Int. Cl.
*H01L 21/311* (2006.01)
*H01L 21/302* (2006.01)

(52) U.S. Cl. . 438/703; 438/737; 438/738; 257/E21.235; 257/E21.305

(58) Field of Classification Search ............... 438/703, 438/737, 738; 257/E21.235, E21.305
See application file for complete search history.

(56) References Cited

U.S. PATENT DOCUMENTS

| | | | |
|---|---|---|---|
| 5,053,105 A * | 10/1991 | Fox, III | 216/40 |
| 7,132,369 B2 * | 11/2006 | Delgadino et al. | 438/723 |
| 7,199,046 B2 * | 4/2007 | Wetzel et al. | 438/637 |
| 7,892,982 B2 * | 2/2011 | Lee et al. | 438/717 |
| 7,972,967 B1 * | 7/2011 | Hyun | 438/703 |
| 2006/0046484 A1 * | 3/2006 | Abatchev et al. | 438/689 |
| 2007/0123037 A1 * | 5/2007 | Lee et al. | 438/636 |

* cited by examiner

*Primary Examiner* — Lex Malsawma
(74) *Attorney, Agent, or Firm* — Scully, Scott, Murphy & Presser, P.C.; Yuanmin Cai

(57) ABSTRACT

A cap material layer is deposited on a metal nitride layer. An antireflective coating (ARC) layer, an organic planarizing layer (OPL), and patterned line structures are formed upon the cap material layer. The pattern in the patterned line structures is transferred into the ARC layer and the OPL. Exposed portions of the cap material layer are etched simultaneously with the etch removal of the patterned line structures and the ARC layer. The OPL is employed to etch the metal nitride layer. The patterned cap material layer located over the metal nitride layer protects the top surface of the metal nitride layer, and enables high fidelity reproduction of the pattern in the metal nitride layer without pattern distortion. The metal nitride layer is subsequently employed as an etch mask for pattern transfer into an underlying layer.

20 Claims, 12 Drawing Sheets

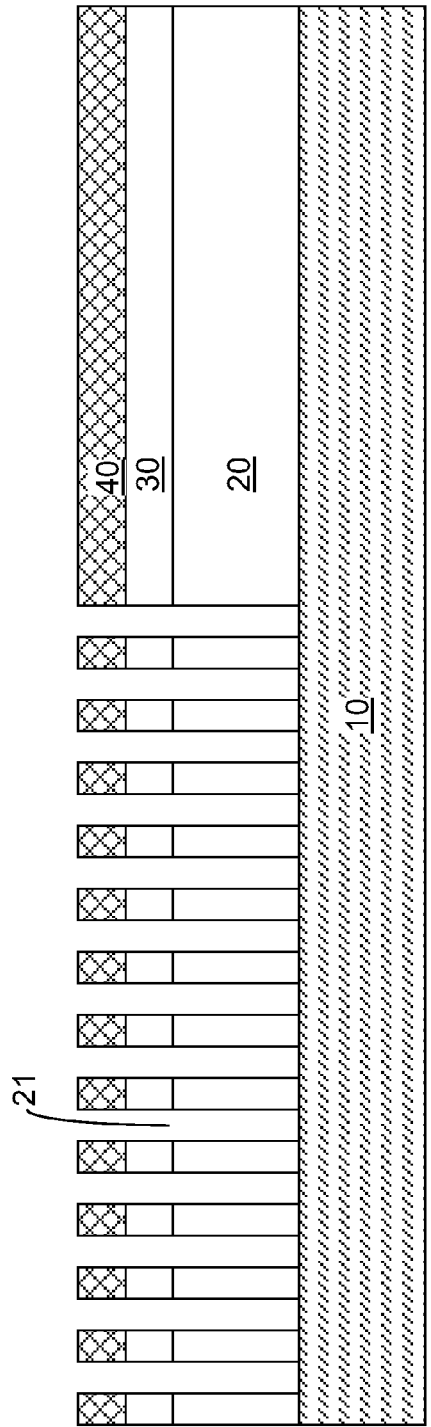
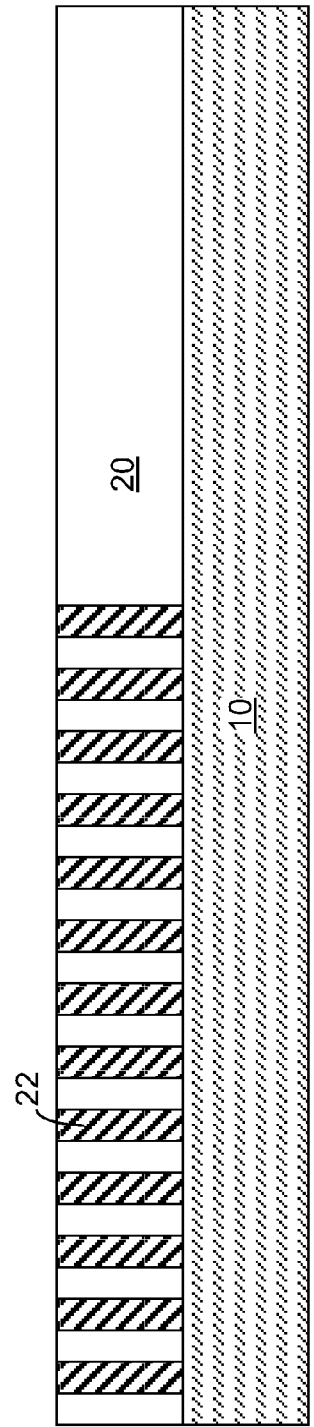
FIG. 12
FIG. 13

SIDEWALL IMAGE TRANSFER PROCESS EMPLOYING A CAP MATERIAL LAYER FOR A METAL NITRIDE LAYER

BACKGROUND

The present disclosure generally relates to a process for manufacturing semiconductor structures, and particularly to methods for sidewall image transfer employing a dielectric cap material layer on top of a metal nitride layer.

A sidewall image transfer (SIT) process as known in the art employs a titanium nitride layer as an etch mask for transferring a composite image of two independent images. An organic planarizing layer (OPL) is formed directly on the titanium nitride layer, and is consumed during the transfer of the composite pattern into the titanium nitride layer. The OPL tends to be consumed during the pattern transfer into the titanium nitride layer, resulting in distortion or loss of fidelity in the transferred pattern in the titanium nitride layer. A method of enhancing the fidelity of pattern transfer during a SIT process is desired.

BRIEF SUMMARY

A cap material layer is deposited on a metal nitride layer. An antireflective coating (ARC) layer, an organic planarizing layer (OPL), and patterned line structures are formed upon the cap material layer. The pattern in the patterned line structures is transferred into the ARC layer and the OPL. Exposed portions of the cap material layer are etched simultaneously with the etch removal of the patterned line structures and the ARC layer. The OPL and the dielectric cap material layer are employed to etch the metal nitride layer. The patterned cap material layer located over the metal nitride layer protects the top surface of the metal nitride layer, and enables high fidelity reproduction of the pattern in the metal nitride layer without pattern distortion. The metal nitride layer is subsequently employed as an etch mask for pattern transfer into an underlying layer.

According to an aspect of the present disclosure, a method of patterning a structure includes: forming a metal nitride layer on a substrate; forming a cap material layer having a different composition than the metal nitride layer directly on the metal nitride layer; forming a stack of an organic planarizing layer (OPL) and an antireflective coating (ARC) layer on the cap material layer; forming patterned line structures including a dielectric material on the ARC layer; simultaneously etching the cap material layer and at least one of the patterned line structures and the ARC layer, wherein a pattern present in the ARC layer is transferred through the OPL and the cap material layer and a top surfaces of the metal nitride layer is exposed after the simultaneous etching; transferring said pattern from the OPL into the metal nitride layer; and transferring said pattern from the metal nitride layer into an upper portion of the substrate.

According to another aspect of the present disclosure, a method of patterning a structure includes: forming a metal nitride layer on a substrate; forming a cap material layer having a different composition than the metal nitride layer directly on the metal nitride layer; forming a stack of an organic planarizing layer (OPL) and an antireflective coating (ARC) layer on the cap material layer; forming patterned line structures including a dielectric material on the ARC layer; simultaneously etching the cap material layer and at least one of the patterned line structures and the ARC layer employing at least the patterned line structures as an etch mask, wherein a pattern present in the ARC layer is transferred through the OPL and the cap material layer, and a top surfaces of the metal nitride layer is exposed after the simultaneous etching; transferring the pattern from the OPL into the metal nitride layer; and transferring the pattern from the metal nitride layer into an upper portion of the substrate.

According to yet another aspect of the present disclosure, a method of patterning a structure includes: forming a metal nitride layer on a substrate; forming a cap material layer having a different composition than the metal nitride layer directly on the metal nitride layer; forming a stack of an organic planarizing layer (OPL) and an antireflective coating (ARC) layer on the cap material layer; forming mandrels having parallel sidewalls on the ARC layer; depositing a conformal dielectric layer on the parallel sidewalls and exposed surfaces of the ARC layer; anisotropically etching the conformal dielectric layer, wherein remaining portions of said conformal dielectric layer form patterned line structures on the parallel sidewalls of the mandrels; simultaneously etching the cap material layer and at least one of the patterned line structures and the ARC layer, wherein a pattern present in the ARC layer is transferred through the OPL and the cap material layer, and a top surfaces of the metal nitride layer is exposed after the simultaneous etching; transferring the pattern from the OPL into the metal nitride layer; and transferring the pattern from the metal nitride layer into an upper portion of the substrate.

BRIEF DESCRIPTION OF THE SEVERAL VIEWS OF THE DRAWINGS

FIG. 12 is a vertical cross-sectional view of a second exemplary structure after transferring the pattern in the metal nitride layer through an underlying material layer according to a second embodiment of the present disclosure.

FIG. 13 is a vertical cross-sectional view of the second exemplary structure after forming conductive line structures within the underlying material layer according to the second embodiment of the present disclosure.

DETAILED DESCRIPTION

Figure 1:
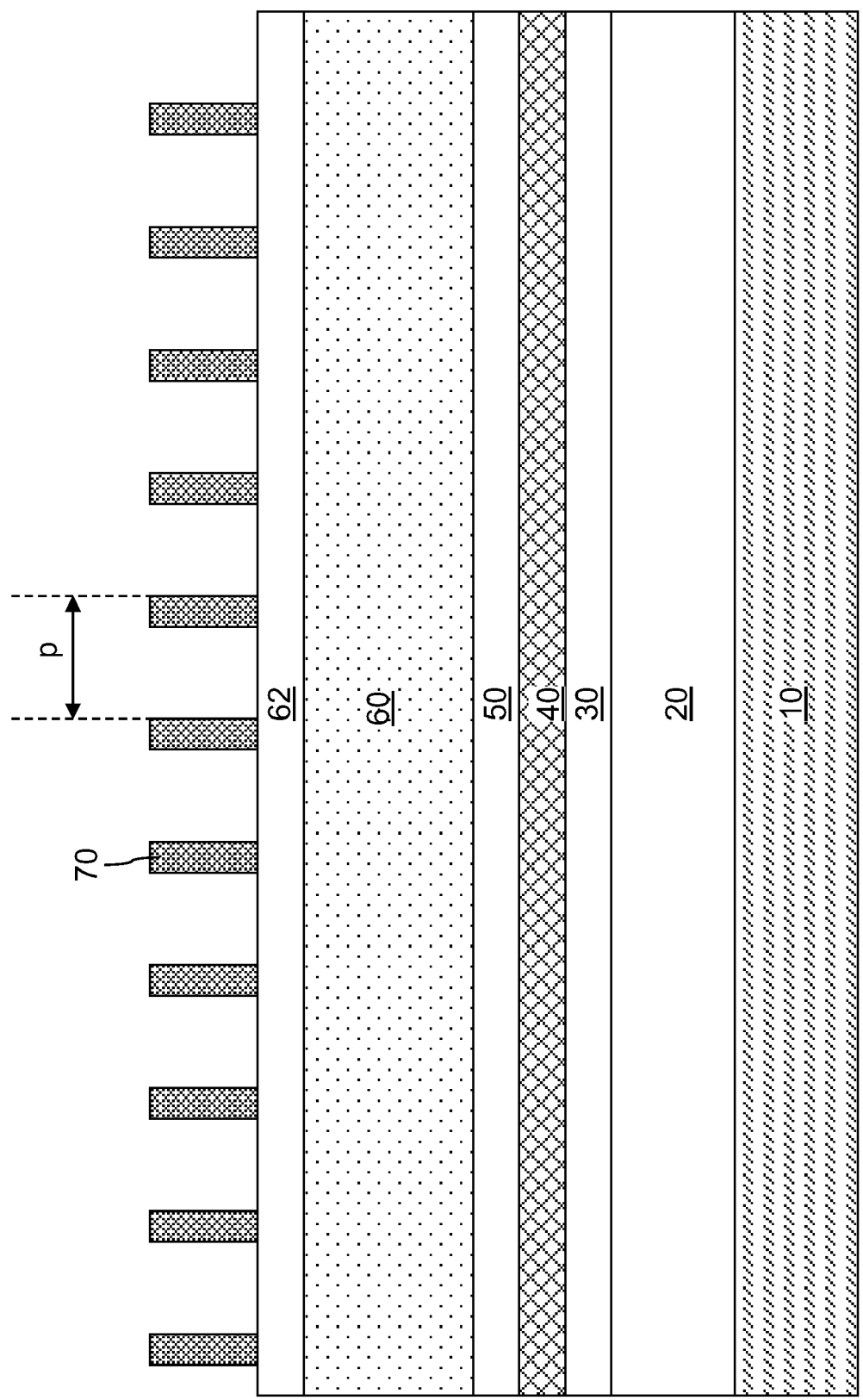
FIG. 1 is a vertical cross-sectional view of a first exemplary structure after deposition of a metal nitride layer, a cap material layer, an organic planarizing layer (OPL), a first antireflective coating (ARC) layer, and mandrels having parallel vertical sidewalls according to a first embodiment of the present disclosure.

As stated above, the present disclosure relates to methods for sidewall image transfer process employing a cap material layer for a dielectric metal nitride layer, which are now described in detail with accompanying figures. It is noted that like reference numerals refer to like elements across different embodiments. The drawings are not necessarily drawn to scale.

Referring to FIG. 1, a first exemplary structure according to a first embodiment of the present disclosure includes a substrate 10 and a material stack formed thereupon. The substrate 10 can include a semiconductor substrate having semiconductor devices (not shown) therein. The semiconductor devices can include, for example, field effect transistors, junction transistors, diodes, resistors, capacitors, inductors, or any other semiconductor device known in the art. The substrate 10 may, or may not, include contact-level dielectric material layers (not shown) and/or interconnect level dielectric material layers (not shown) as well as embedded contact via structures (not shown) and/or embedded wiring level metal interconnect structures. Alternately, the topmost portion of the substrate 10 can include a semiconductor material such as single crystalline silicon.

An underlying material layer 20 can be formed on the substrate 10. The underlying material layer 20 can be a single dielectric material layer, a plurality of dielectric material layers, or a stack of at least one dielectric material layer and a conductive material layer. For example, the underlying material layer 20 can be a wiring-level dielectric material layer, a contact-level dielectric material layer, a conductive material layer such as a metal layer or a doped semiconductor layer, or layers for a gate stack such as a stack of a gate dielectric layer and a gate conductor layer. Exemplary materials that can be included in the underlying material layer include, but are not limited to, silicon oxide, silicon nitride, silicon oxynitride, organosilicate glass, gate dielectric materials known in the art, gate conductor materials known in the art, doped semiconductor materials, and conductive metallic materials. The underlying material layer 20 can be deposited, for example, by chemical vapor deposition (CVD), spin coating, or by any other deposition method known in the art. The thickness of the underlying material layer 20 can be from 10 nm to 2,000 nm, although lesser and greater thicknesses can also be employed.

An adhesion promotion layer 30 can be optionally deposited on the top surface of the underlying material layer 20. The adhesion promotion layer 30 can help enhance adhesion of subsequently deposited material layers to the underlying material layer 20. The adhesion promotion layer 30 can include a dielectric material such as silicon oxide, although other materials can be employed for the adhesion promotion layer provided that the material enhances adhesion between the underlying material layer 20 and a metal nitride layer to be subsequently deposited. If the adhesion promotion layer 30 includes silicon oxide, the adhesion promotion layer 30 can be deposited by a chemical vapor deposition (CVD) using tetraethylorthosilicate (TEOS) as a precursor material. Silicon oxide derived from TEOS, commonly referred to as TEOS oxide, can be deposited by low pressure chemical vapor deposition (LPCVD) or plasma enhanced chemical vapor deposition (PECVD). The thickness of the adhesion promotion layer 30 can be from 3 nm to 60 nm, and typically from 6 nm to 30 nm, although lesser and greater thicknesses can also be employed.

A metal nitride layer 40 is deposited on the adhesion promotion layer 30, or on the underlying material layer 20 if an adhesion promotion layer is present. The metal nitride layer 40 includes a metal nitride such as TiN, TaN, WN, or other metal nitride that can function as an etch mask for etching the material of the underlying material layer 20. Thus, the composition of the metal nitride layer 40 can be selected depending on the composition of the underlying material layer 20. For an underlying material layer 20 including dielectric materials, TiN, TaN, and WN generally function as a suitable etch mask material. In one embodiment, TiN is preferred because TiN provides high etch selectivity relative to silicon oxide, silicon nitride, organosilicate glass, and semiconductor materials such as silicon and germanium. For an underlying material layer including other materials (such as conductive materials), the composition of the metal nitride layer can be optimized to enhance the etch selectivity of an etch process that employs the metal nitride layer as an etch mask.

The metal nitride layer 40 can be deposited, for example, by chemical vapor deposition (CVD), physical vapor deposition (PVD), or a combination thereof. The thickness of the metal nitride layer 40 can be from 2 nm to 60 nm, and typically from 4 nm to 30 nm, although lesser and greater thicknesses can also be employed.

A cap material layer 50 is deposited on the metal nitride layer 40. The cap material layer 50 includes a material different from the material of the metal nitride layer 40.

In one embodiment, the cap material layer 50 includes a dielectric material. Exemplary dielectric materials that can be employed for the cap material layer 50 include, but are not limited to, silicon oxide, silicon nitride, silicon carbide, and combinations thereof. If the cap material layer 50 includes a dielectric material, the cap material layer 50 can be deposited, for example, by chemical vapor deposition (CVD), molecular layer deposition (MLD), and/or spin coating. A thermal treatment (such as an anneal) or a radiation treatment (such as exposure to ultraviolet light) can be performed on the cap material layer as needed. The thickness of the cap material layer 50 including a dielectric material can be from 2 nm to 60 nm, and typically from 4 nm to 30 nm, although lesser and greater thicknesses can also be employed.

In another embodiment, the cap material layer 50 includes a conductive material. Exemplary conductive materials that can be employed for the cap material layer 50 include, but are not limited to, TaN, WN, Ti, Ta, W, Cu, and combinations thereof. For example, the metal nitride layer 40 can be a TiN layer, and the cap material layer 50 can include a metallic material different from TiN. If the cap material layer 50 includes a metallic material, the cap material layer 50 can be deposited, for example, by physical vapor deposition (PVD), chemical vapor deposition (CVD), or a combination thereof. The thickness of the cap material layer 50 including a metallic material can be from 3 nm to 100 nm, and typically from 10 nm to 50 nm, although lesser and greater thicknesses can also be employed.

An organic planarizing layer (OPL) is deposited on the surface of the cap material layer 50. This OPL is herein referred to as a first OPL 60. The first OPL 60 includes a non-photosensitive organic polymer including carbon, hydrogen, oxygen, and optionally fluorine. For example, the first OPL 60 can include hydrocarbons and/or hydrofluorocarbons. The first OPL 60 can be formed, for example, by spin coating. The thickness of the first OPL 60 can be from 50 nm to 300 nm, although lesser and greater thicknesses can also be employed.

An antireflective coating (ARC) layer is deposited on the first OPL 60. The antireflective coating (ARC) layer is herein referred to as the first antireflective coating (ARC) layer 62. The first ARC layer 62 can include a hydrocarbon based material having a different material composition than the first OPL 60. In one embodiment, the first ARC layer 62 comprises silicon at an atomic concentration from 1% to 50%, and typically from 15% to 43%. In another embodiment, the first ARC layer 62 comprises a refractory metal at an atomic concentration from 1% to 50%, and typically from 8% to 45%. The first ARC layer 62 controls reflectivity of the surface (i.e., the surface of the cap material layer 50) over which the first OPL 60 is patterned by reducing standing waves and optical notching. The thickness of the first ARC layer 62 may be from 15 nm to 150 nm, and typically from 30 nm to 100 nm, although lesser and greater thicknesses are explicitly contemplated herein. The first ARC layer can be applied, for example, by spin coating.

A mandrel material layer is deposited on the first ARC layer 62. The mandrel material layer can include a photoresist, an amorphous carbon layer, or a material that can be removed selective to the material of a conformal dielectric layer to be subsequently deposited. The mandrel material layer is deposited as a blanket layer (unpatterned layer), for example, by chemical vapor deposition (CVD) or spin coating. The thickness of the mandrel material layer can be from 30 nm to 300 nm, and typically from 60 nm to 150 nm, although lesser and greater thicknesses can also be employed.

In one embodiment, the mandrel material layer is a photoresist layer that can be directly patterned by lithographic exposure and development. The mandrel material layer is patterned by lithographic means, i.e., exposure and development, to form mandrels 70. The lithographic pattern may be a pattern of a periodic array, or may be an irregular pattern. Preferably, the lithographic pattern is a pattern of a regular periodic array. The lithographic pattern may contain an array of lines and spaces, or may contain a pattern of via holes in a matrix of the mandrel material layer, or may contain a pattern of isolated structures separated from one another by a contiguous cavity that laterally surrounds each isolated structure, i.e., each mandrel 70. Each of the mandrels 70 may be separated from one another as in the case of a lithographic pattern containing an array of lines and spaces, or may be adjoined among one another as in the case of a lithographic pattern containing an array of via holes.

In case the pattern in the mandrels 70 comprises a periodic one dimensional array, the pitch of the pattern in the mandrels 70 is a lithographic dimension, which is herein referred to as a lithographic pitch p. If the pattern in the mandrels 70 is a pattern of lines and spaces, the lithographic pitch p is the lateral dimension of a unit pattern comprising one line and one space. If the pattern in the mandrels 70 is a pattern of via holes in a matrix of a contiguous mandrel 70, the lithographic pitch is the lateral dimension of a unit pattern comprising at least one via hole. In addition to having periodicity in one direction at the lithographic pitch p, the pattern in the mandrels 70 may have another periodicity in another direction. Optionally, overexposure or underexposure may be employed so that the width of each pattern between a neighboring pair of the mandrels 70 is less than one half of the lithographic pitch p.

The lithographic pitch p is a lithographic dimension, i.e., a dimension that may be formed by lithographic means. The lithographic pitch p is the same as, or greater than, the minimum lithographic pitch that may be obtained by commercially available lithography tools. For example, if ArF lithography employing 193 nm wavelength light is used, the lithographic pitch p is the same as, or greater than 80 nm, which is the lithographic minimum pitch.

In other embodiments, the mandrel material layer includes amorphous carbon or other non-photosensitive material. In such embodiments, a photoresist (not shown) can be applied over the mandrel material and is lithographically patterned into shapes including multiple parallel lines. In one embodiment, the multiple parallel lines can have the same width and the same pitch. The pitch of the multiple parallel lines is a lithographic pitch, i.e., a pitch that can be printed by a single lithographic exposure employing a commercially available lithography tool and photoresist. A minimum lithographic pitch is herein referred to as a critical pitch, and a pitch that is less than the critical pitch is herein referred to as a sublithographic pitch. The pattern in the photoresist is transferred into the mandrel material layer to pattern the mandrel material layer into mandrels 70. In the case amorphous carbon or even amorphous silicon is employed as the mandrel material, the first OPL layer 60 can be replaced by a organic layer that has degas temperature higher than the mandrel deposition temperature. In one embodiment, OPL layer 60 can be replaced by amorphous carbon material through CVD deposition.

The mandrels have parallel sidewalls. The parallel sidewalls of the mandrels may vertically coincide with parallel sidewalls of the patterned photoresist, or may be laterally recessed inward (so that the mandrels 70 have lesser widths than the widths of the patterned photoresist). In one embodiment, the mandrels 70 have a lithographic pitch in one direction, which is a horizontal direction perpendicular to the parallel sidewalls of the mandrels 70.

Figure 2:
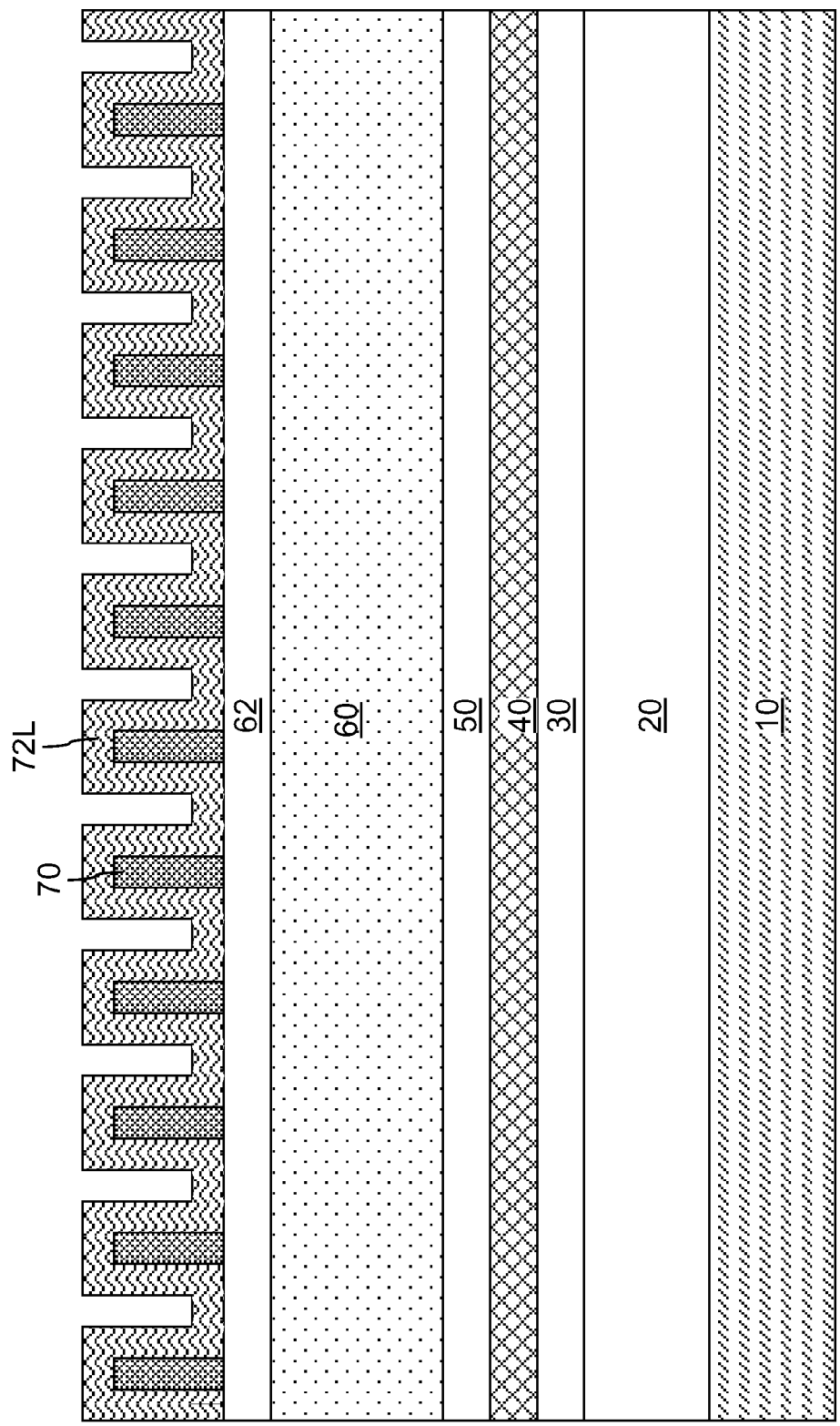
FIG. 2 is a vertical cross-sectional view of the first exemplary structure after deposition of a conformal dielectric layer according to the first embodiment of the present disclosure.

Referring to FIG. 2, a conformal dielectric layer 72L is deposited on the mandrels 70 and the exposed top surface of the first ARC layer 62. The conformal dielectric layer 72L is deposited employing a conformal deposition method such as molecular layer deposition (MLD), in which multiple reactants are alternately provided in a process chamber to deposit the conformal dielectric layer. In MLD, the deposition of the material of the conformal dielectric layer 72L occurs one molecular layer at a time. The dielectric material of the conformal dielectric layer 72L can include, but is not limited to, silicon oxide, silicon nitride, or a combination thereof. The temperature of the deposition process is maintained below the decomposition temperature of the material of the mandrels 70.

In one embodiment, the mandrels 70 include a photoresist, and the conformal dielectric layer includes silicon dioxide. Silicon oxide can be deposited at room temperature employing a molecular layer deposition process.

In another embodiment, the mandrels 70 include amorphous carbon, and the conformal dielectric layer includes silicon oxide or silicon nitride. Silicon nitride can be deposited at a temperature about 400° C. employing a molecular layer deposition process.

Any other combination of materials for the mandrels 70 and the conformal dielectric layer 72L can be employed provided that the material of the mandrels 70 can withstand the deposition process for the conformal dielectric layer, that the conformal dielectric layer 72L can be conformally deposited on the sidewalls of the mandrels 70, and that the mandrels can be removed selective to the material of the conformal dielectric layer 72L and the first ARC layer 62.

Figure 3:
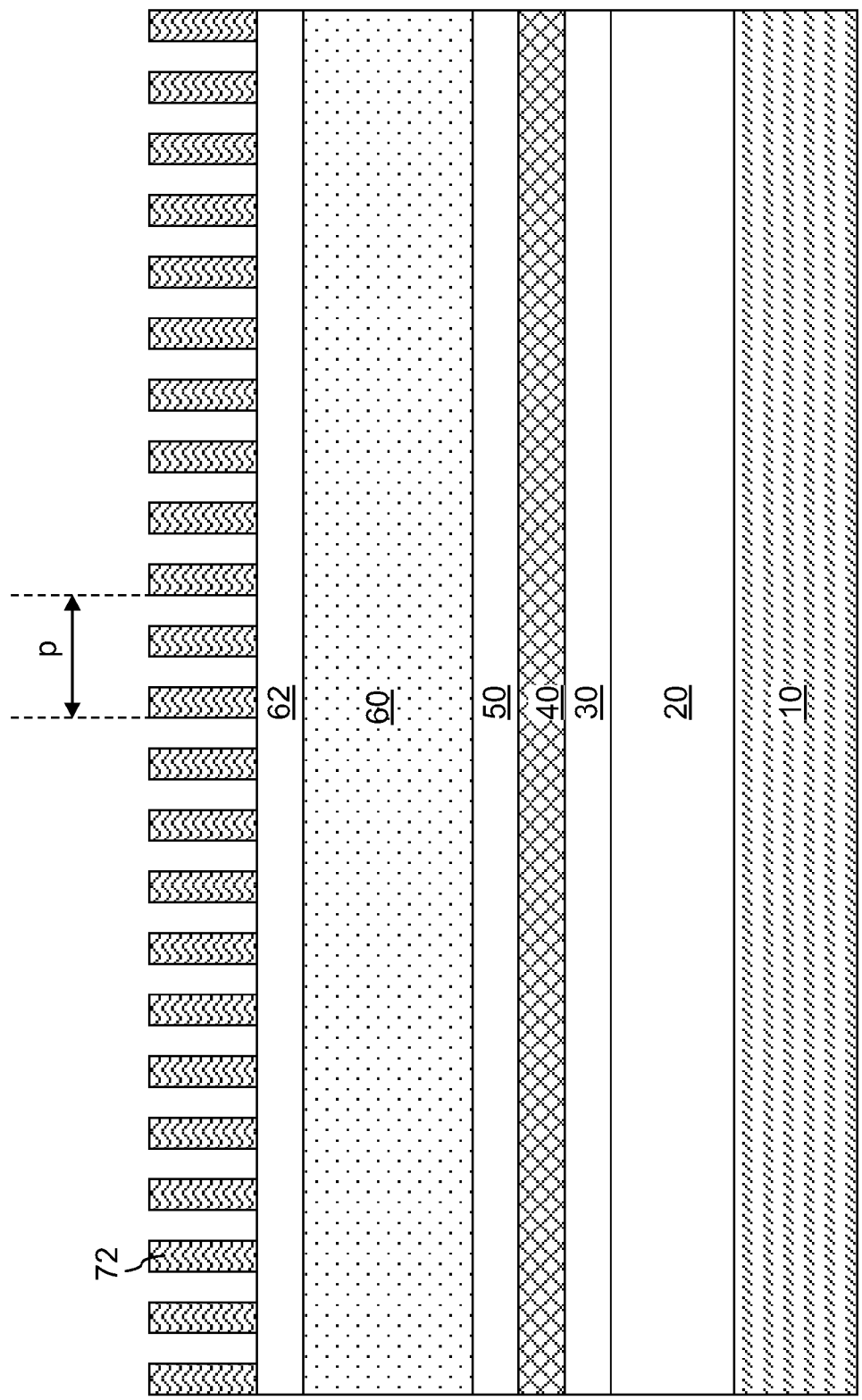
FIG. 3 is a vertical cross-sectional view of the first exemplary structure after formation of patterned line structures by anisotropically etching the conformal dielectric layer and removal of the mandrels according to the first embodiment of the present disclosure.

Referring to FIG. 3, an anisotropic etch is performed to remove horizontal portions of the conformal dielectric layer 72L. The vertical portions of the conformal dielectric layer 72L that remains on the vertical sidewalls of the mandrels 70 constitute patterned line structures 72, which include the same dielectric material as the conformal dielectric layer 72L.

The mandrels 70 are removed by another etch, which can be an anisotropic etch or an isotropic etch, that is selective to the materials of the patterned line structures 72 and the first ARC layer 62.

The pattern in the patterned line structures 72 is herein referred to as a first pattern. The first pattern may include two patterned line structures within a lithographic pitch p. If the lithographic pitch is a minimum lithographic pitch that can be lithographically printed, the width of the patterned line structures 72 can be a sublithographic width, i.e., a width that is less than the minimum width of a patterned structure that can be formed by single exposure and development.

Figure 4:
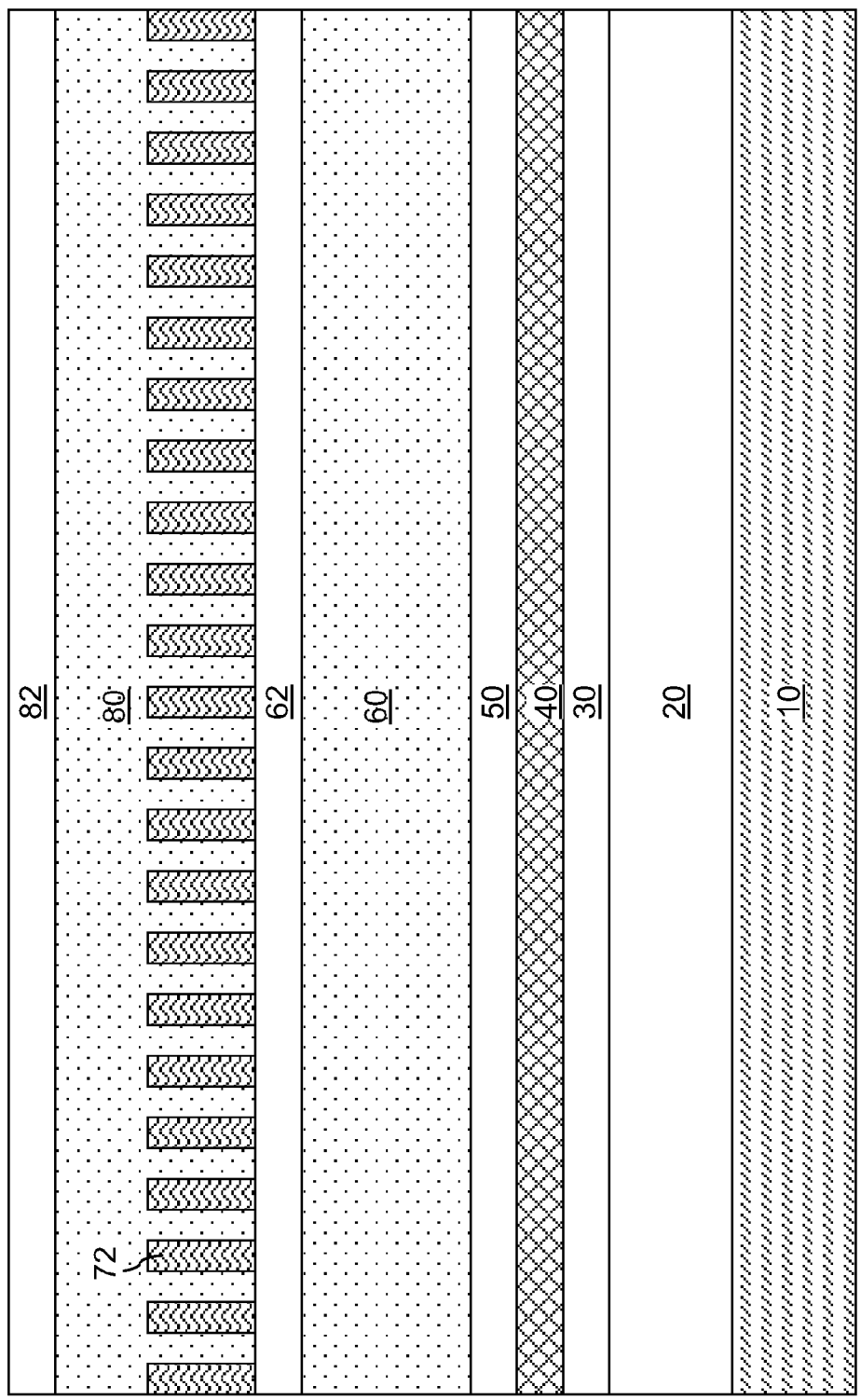
FIG. 4 is a vertical cross-sectional view of the first exemplary structure after deposition of a second OPL and a second ARC layer according to the first embodiment of the present disclosure.

Referring to FIG. 4, a stack of a blanket organic planarizing layer and another antireflective coating layer is deposited, for example, by a spin coating. The blanket organic planarizing layer is herein referred to as a second OPL 80, which can have the same composition and range of thickness as the first OPL 60. The same deposition method can be employed for the second OPL 80 as for the first OPL 60. The other antireflective coating layer is herein referred to as a second ARC layer 82, which can have the same composition and range of thickness as the first ARC layer 62. The same deposition method can be employed for the second ARC layer 82 as for the first ARC layer 62.

Figure 5:
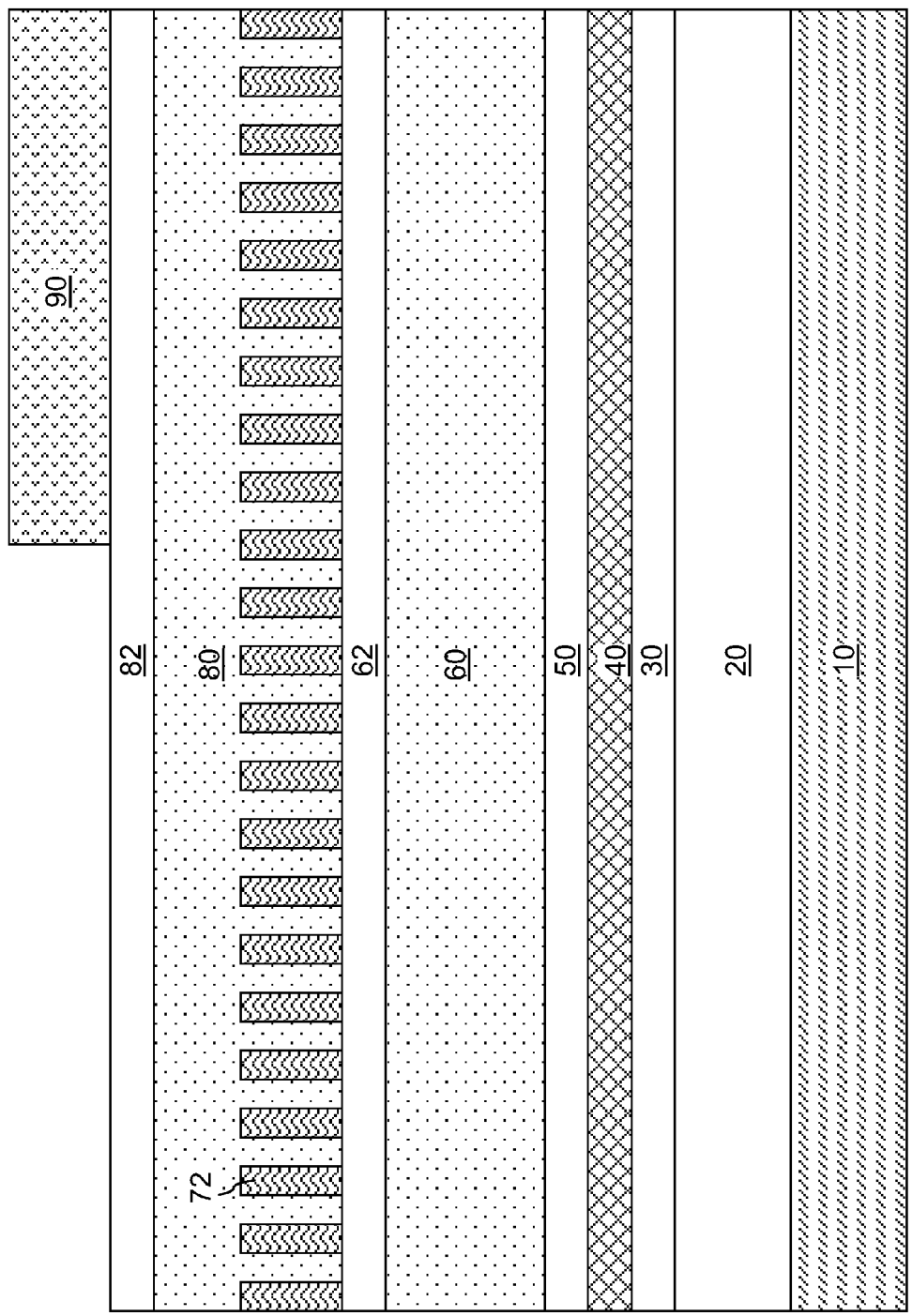
FIG. 5 is a vertical cross-sectional view of the first exemplary structure after application and lithographic patterning of a block level photoresist according to the first embodiment of the present disclosure.

Referring to FIG. 5, a block level photoresist 90 is applied over the stack of the second OPL 80 and the second ARC layer 82. The block level photoresist 90 is applied directly on the second ARC layer 82. The block level photoresist 90 is lithographically patterned to block areas in which the transfer of the pattern in the patterned line structures 72 is not desired. Specifically, openings in the block level photoresist 90 are formed only in areas within which the pattern of the patterned line structures is to be transferred to underlying layers.

The lithographic pattern of the block level photoresist 90, which is herein referred to as a second pattern, may be a pattern of a periodic array, or may be an irregular pattern. In some embodiments, the dimensions of the second pattern are longer than the lithographic pitch p in the first pattern. The second pattern defines areas in which the first pattern is to be transferred during a subsequent image transfer, which is referred to as a sidewall image transfer (SIT) process. The area of the opening in the patterned block level photoresist 90 corresponds to the area in which the first pattern is subsequently transferred into the cap material layer 50 and the metal nitride layer 40, and the area in which the patterned block level photoresist 90 is present corresponds to the area within which the first pattern is not to be transferred.

Figure 6:
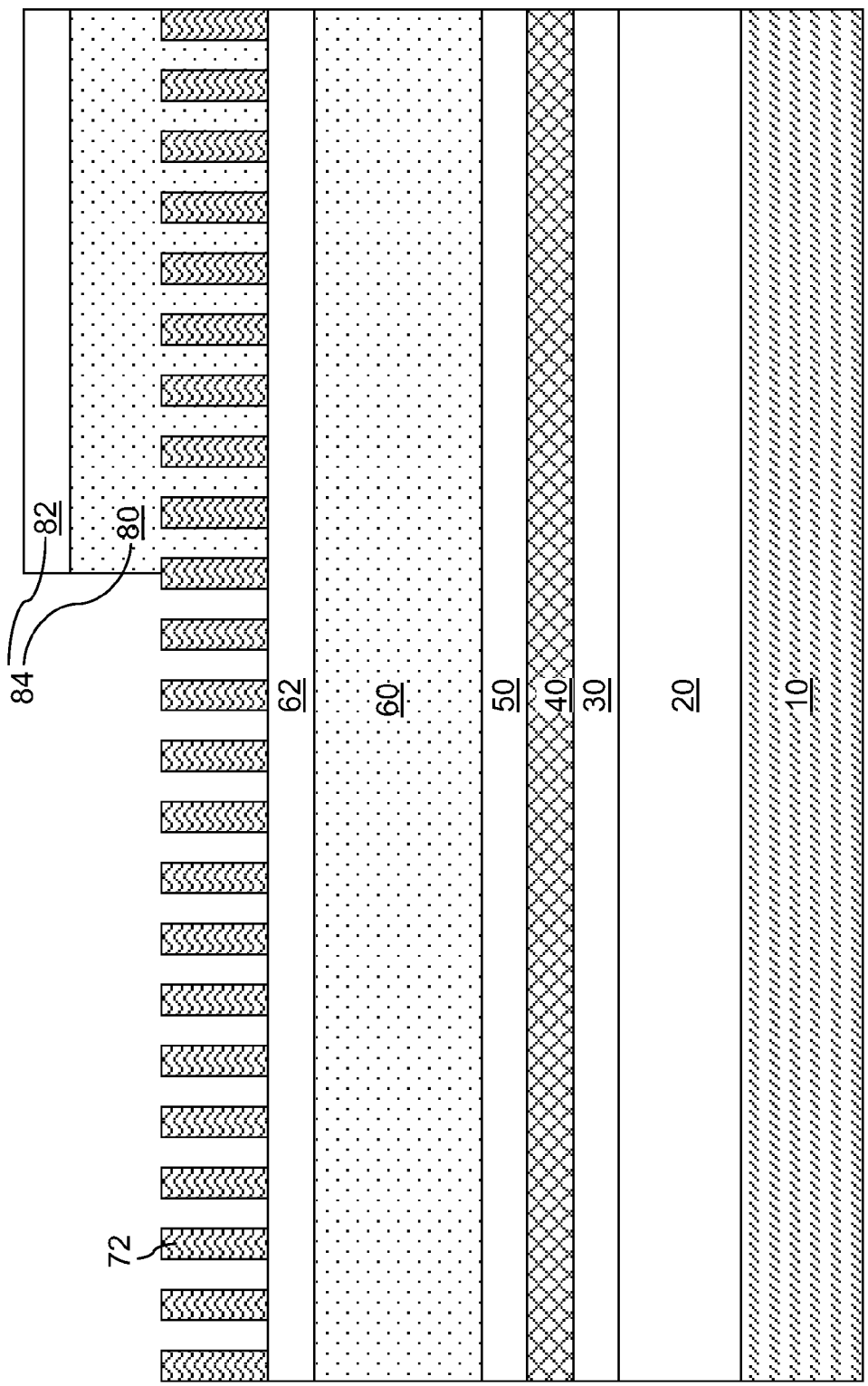
FIG. 6 is a vertical cross-sectional view of the first exemplary structure after etching portions of the second ARC layer and the second OPL that are not covered by the patterned photoresist according to the first embodiment of the present disclosure.

Referring to FIG. 6, exposed portions of the second ARC layer 82 and the second OPL that are not covered by the patterned block level photoresist 90 are removed by an etch that employs the patterned block level photoresist 90 as an etch mask. This etch can be an anisotropic etch. The second ARC layer 82 and second OPL 80 are patterned to replicate the pattern in the patterned block level photoresist 90, i.e., the patterned remaining portion of the blanket OPL as originally deposited is the patterned second OPL 80. The patterned block level photoresist 90 is removed by the end of OPL layer 80 patterning. The pattern of the patterned line structures 72 is exposed within the area from which the second OPL 80 is removed, and the rest of the patterned line structures 72 outside the exposed area are covered by the patterned second OPL 80 and the second ARC layer 82. The patterned line structures 72 are exposed outside the area of the patterned stack 84 after the patterning of the stack of the second ARC layer 82 and the second OPL 80.

Figure 7:
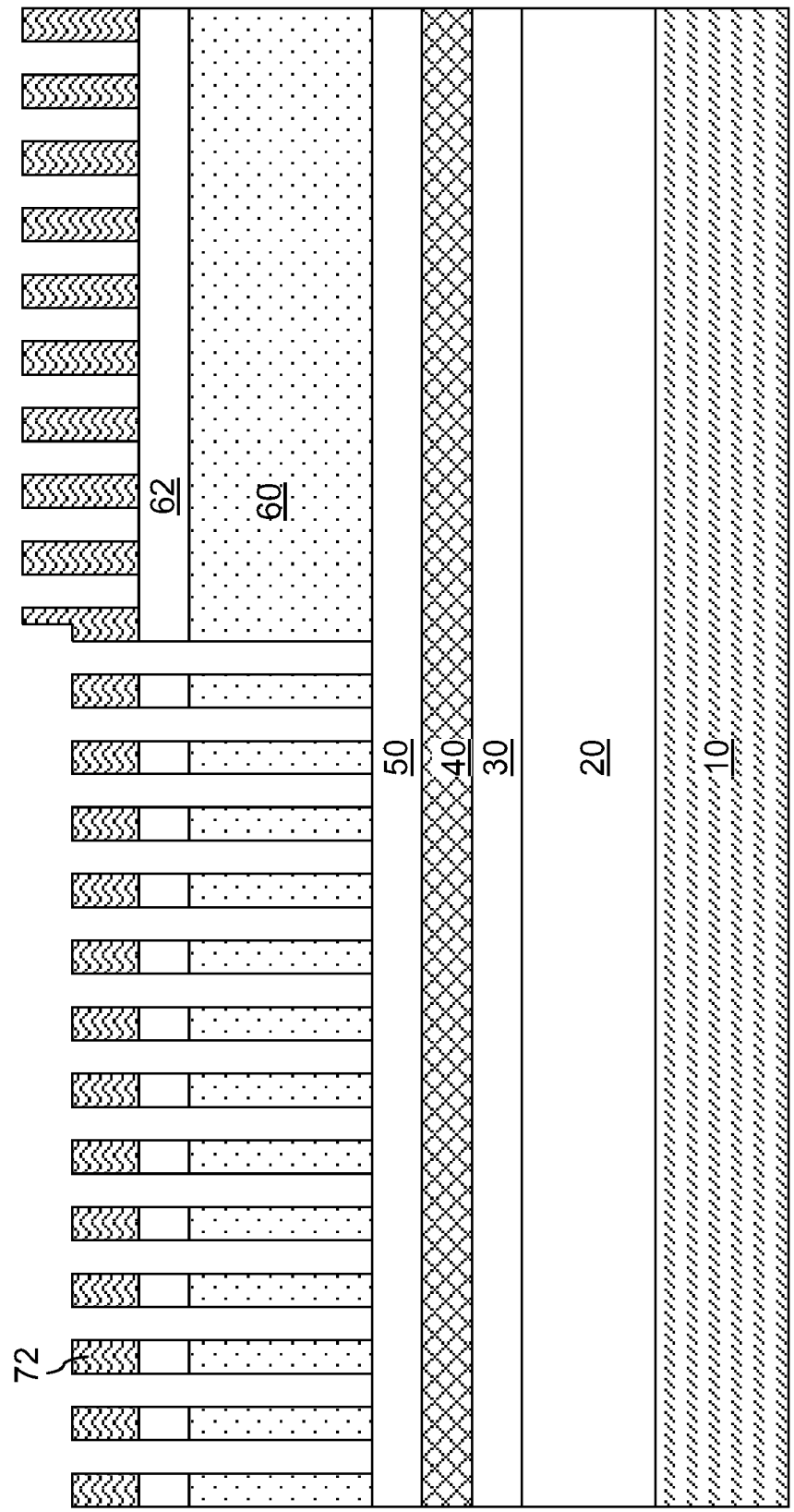
FIG. 7 is a vertical cross-sectional view of the first exemplary structure after simultaneous etching of the remaining portions of the second ARC layer and exposed portions of the first ARC layer, followed by simultaneous etching of the second OPL and exposed portions of the first OPL according to the first embodiment of the present disclosure.

Referring to FIG. 7, the remaining second ARC layer 82 and the exposed portions of the first ARC layer 62 between the exposed patterned line structures 72 are simultaneously etched. Specifically, exposed portions of the first ARC layer 62 and the remaining portion of the second ARC layer 82 are etched simultaneously in an etch, which can be an anisotropic etch. This anisotropic etch is herein referred to as a first anisotropic etch. The pattern of the patterned line structures 72 is transferred into the first ARC layer 62 within the area in which the second OPL 80 is not present. Openings are formed within the first ARC layer 62 during the anisotropic etch employing at least the patterned line structures 72 as an etch mask. If the block level photoresist 90 is employed in previous processing steps, the first ARC layer 62 is patterned during the anisotropic etch employing a combination of the patterned line structures 72 and the patterned second OPL 80 as an etch mask.

Once the second ARC layer 82 and the exposed portions of the first ARC layer 62 are etched through, the second OPL 80 and the portions of the first OPL underlying the openings in the first ARC layer are simultaneously etched, for example, by another anisotropic etch, which is herein referred to as a second anisotropic etch. Thus, the patterned second OPL 80 and portions of the first OPL 60 that are not covered by the patterned line structures or the second OPL 80 are etched by this anisotropic etch. This anisotropic etch proceeds until the second OPL 80 is completely consumed and the trenches formed within the first OPL 60 extends to the bottom surface of the first OPL 60, i.e., to the top surface of the cap material layer. Thus, while the patterned line structures 72 are partly removed, the pattern present in the patterned line structures 72 within the area not covered by the second OPL is transferred through the first ARC layer, and the first OPL.

Figure 8:
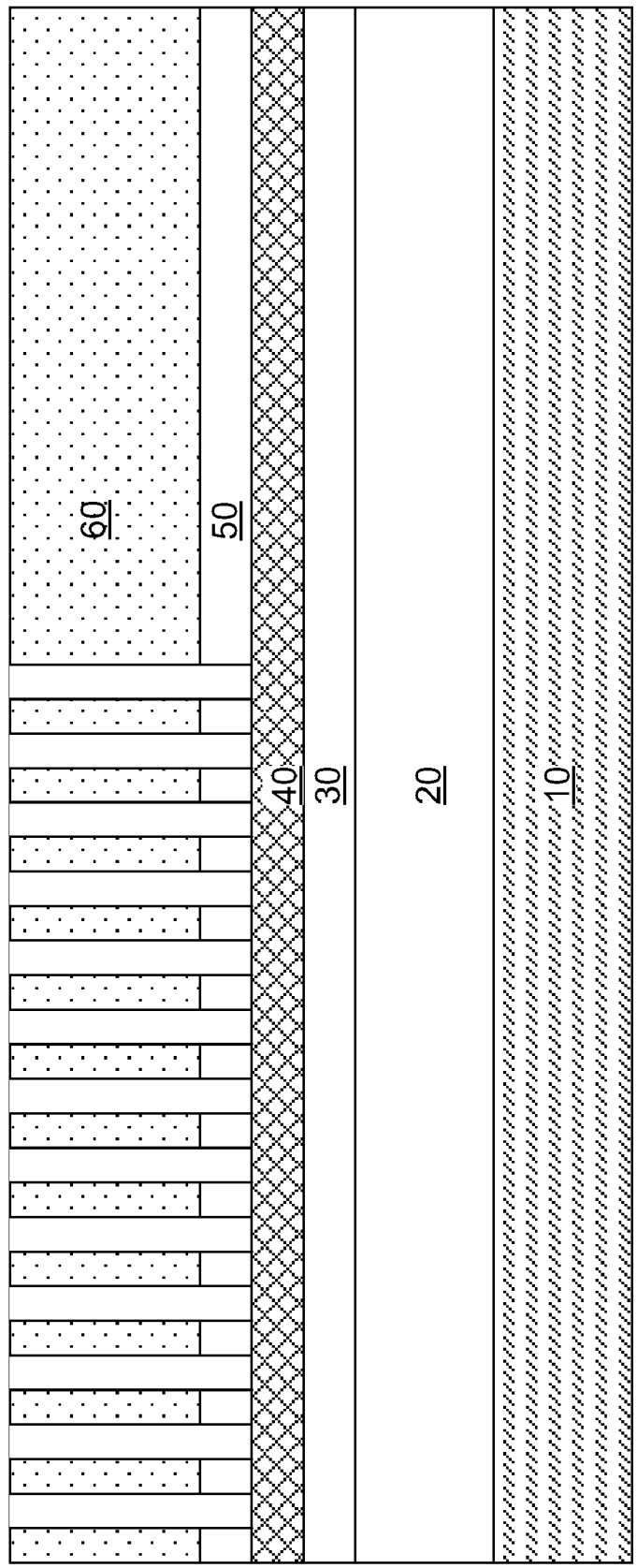
FIG. 8 is a vertical cross-sectional view of the first exemplary structure after simultaneous etching of the patterned spacer line structures, the first ARC layer, and exposed portions of the cap material layer according to the first embodiment of the present disclosure.

Referring to FIG. 8, the patterned line structures 72, the first ARC layer 62, and the exposed portions of the cap material layer 50 underneath the trenches within the first OPL are simultaneously etched by another etch, which can be an anisotropic etch. This anisotropic etch is herein referred to as a third anisotropic etch. The pattern in the first ARC layer 62 is transferred into the cap material layer 50. The third anisotropic etch can be a reactive ion etch employing a plasma of at least one fluorocarbon gas such as $CF_4$, $CHF_3$, and $C_4F_8$.

Argon or nitrogen can also be added to the plasma. In general, the chemistry of the third anisotropic etch is selected to simultaneously etch the material of the cap material layer 50 and the materials for the patterned line structures and/or the first ARC layer 62. Thus, the pattern in the first OPL 60 is transferred into the cap material layer 50 to form a pattern of trenches therein, and the top surface of the metal nitride layer 40 is exposed at the bottom of the trenches. In one embodiment, the patterned line structures 72 and the first ARC layer 62 are consumed during the third anisotropic etch.

While the first, second, and third anisotropic etches are described herein as three distinctive consecutive etch steps, any pair of two adjacent anisotropic etches or all three anisotropic etches can be integrated into a single anisotropic etch step that employs the same etch chemistry throughout or changes the etch chemistry during the etch process.

Figure 9:
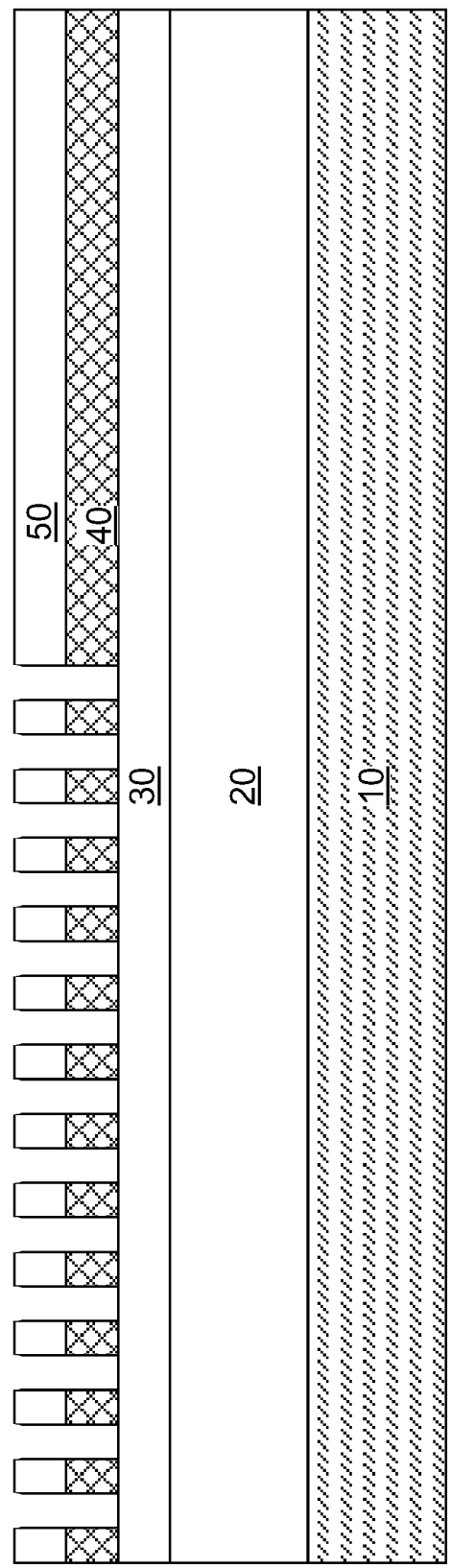
FIG. 9 is a vertical cross-sectional view of the first exemplary structure after etching exposed portions of the metal nitride layer employing the first OPL as an etch mask according to the first embodiment of the present disclosure.

Referring to FIG. 9, exposed portions of the metal nitride layer 40 is etched employing the first OPL 60 and the cap material layer 50 as the etch mask.

The pattern present in the cap material layer 50 and the first OPL 60 and transferred into the metal nitride layer 40 is a composite pattern of the first pattern and the second pattern because only the portion of the first pattern that is located within the openings of the block level photoresist 90, as defined by the second pattern, is transferred into the cap material layer 50 and the first OPL 60, and subsequently into the metal nitride layer 40. Etch chemistry that removes a metal nitride layer with high selectivity to an organic planarizing material is not known in the art. Thus, it is inevitable that a significant portion of the first OPL 60 is consumed during the transfer of the pattern in the first OPL 60 into the metal nitride layer 40.

In one embodiment, the first OPL 60 is partially consumed during the pattern transfer into the metal nitride layer 40. A substantial portion of the first OPL 60 is consumed during the pattern transfer into the metal nitride layer 40, but a portion of the first OPL may be present at the end of this pattern transfer. In another embodiment, all or almost all of the first OPL 60 is consumed during the pattern transfer into the metal nitride layer 40, i.e., by the time the metal nitride layer 40 is etched through. In such embodiment, the presence of the composite pattern within the cap material layer 50 enhances the fidelity of pattern replication in the metal nitride layer 40 because the effect of erosion of the first OPL 60 toward the end of the pattern transfer does not affect the fidelity of the pattern that is present in the cap material layer 50. In other words, the combination of the cap material layer 50 and the first OPL 60 function as an etch mask so that the erosion of edges in the first OPL 60 during the etch does not affect the fidelity of the pattern transfer, but the pattern present in the cap material layer 50 is replicated with high fidelity even if the pattern in the first OPL 60 is degraded toward the end of the etch process due to edge erosion. Any residual first OPL at the end of the etch is removed, for example, by ashing.

Figure 10:
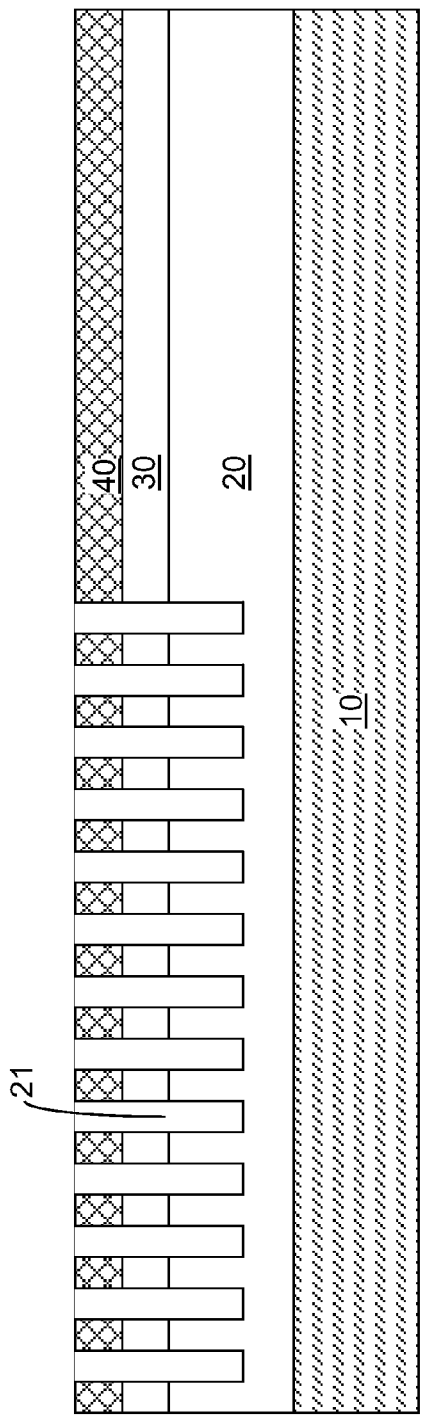
FIG. 10 is a vertical cross-sectional view of the first exemplary structure after transferring the pattern in the metal nitride layer into an underlying material layer according to the first embodiment of the present disclosure.

Referring to FIG. 10, the pattern in the metal nitride layer 40 is transferred into the underlying material layer 20, for example, by an anisotropic etch such as a reactive ion etch. The underlying material layer 20 is located in the upper portion of the substrate 10. In one case, the cap material layer 50 may be removed selective to the metal nitride layer 40 prior to the transfer of the pattern through the adhesion promotion layer 30, if present, and into the underlying material layer 20. In another case, the cap material layer 50 may be employed as an additional etch mask that is consumed during an initial phase of the anisotropic etch that transfers the pattern in the metal nitride layer 40 through the adhesion promotion layer 30, if present, and into the underlying material layer 20. In this case, the combination of the cap material layer 50 and the metal nitride layer 40 is employed as an etch mask for transferring the composite pattern of the first pattern and the second pattern into the underlying material layer 20. Once the cap material layer 50 is consumed, the metal nitride layer is used as the etch mask.

The underlying material layer 20 can be a dielectric material layer such as a contact-level dielectric material layer in which contact via structures can be subsequently formed, or a wiring-level dielectric material layer in which metal line structures or metal via structures can be subsequently formed. The trenches 21 formed in the underlying material layer 20 can extend to a depth between the top surface and the bottom surface of the underlying material layer 20.

Figure 11:
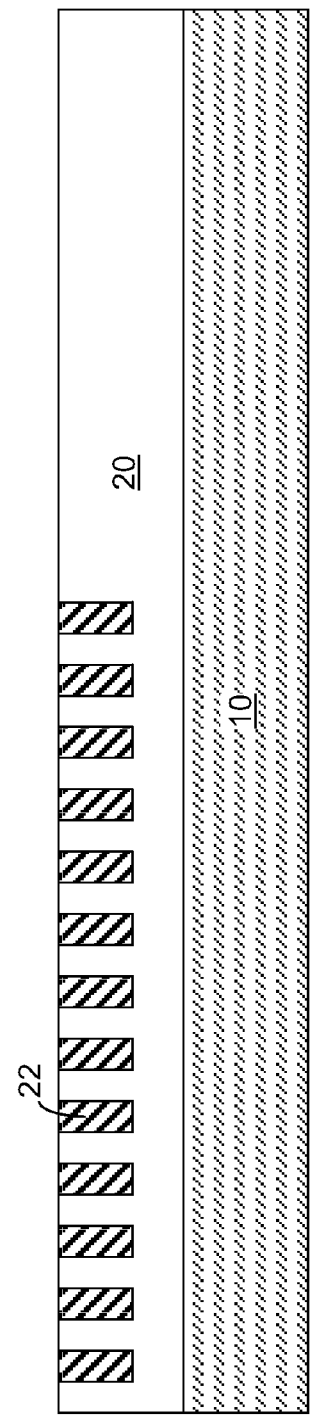
FIG. 11 is a vertical cross-sectional view of the first exemplary structure after forming conductive line structures within the underlying material layer according to the first embodiment of the present disclosure.

Referring to FIG. 11, conductive line structures 22 are formed within the underlying material layer 20 by depositing a conductive material such as Cu or W into the trenches 21 in the underlying material layer 20, and removing excess conductive material above the topmost surface of the underlying material layer 20 or the adhesion promotion layer 30, for example, by chemical mechanical planarization (CMP). The remaining portions of the metal nitride layer 40 can be removed during the removal of the excess conductive material from above the underlying material layer 20. Optionally, the adhesion promotion layer 30 may be removed.

Referring to FIG. 12, a second exemplary structure according to a second embodiment of the present disclosure can be derived from the first exemplary structure by extending the duration of the etch and the depth of the trenches 21 at a processing step corresponding to FIG. 10. The trenches 21 are extended to the bottom of the underlying material layer 20 at the end of the etch step.

Referring to FIG. 13, conductive line structures 22 are formed within the underlying material layer 20 employing the same processing steps as in the first embodiment.

Figure 14:
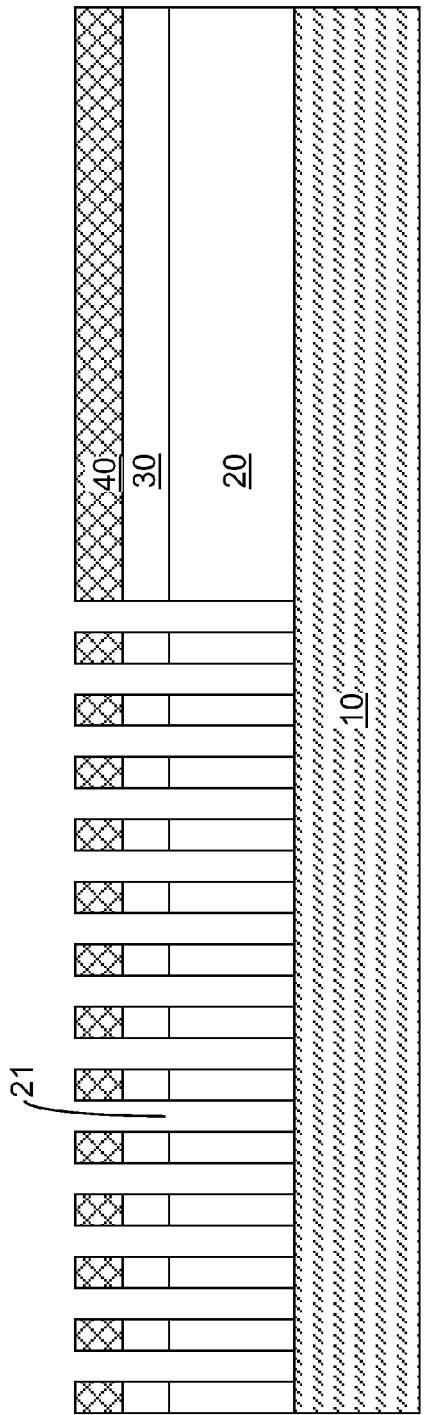
FIG. 14 is a vertical cross-sectional view of a third exemplary structure after forming trenches in the underlying material layer including a conductive material according to a third embodiment of the present disclosure.

Referring to FIG. 14, in a third exemplary structure according to a third embodiment of the present disclosure, the underlying material layer 20 can include a conductive material. The trenches 21 are formed through the underlying material layer 20 to the top surface of the substrate 10, which may include a dielectric surface. The underlying material layer 20 can be patterned into multiple conductive portions that do not contact one another.

Figure 15:
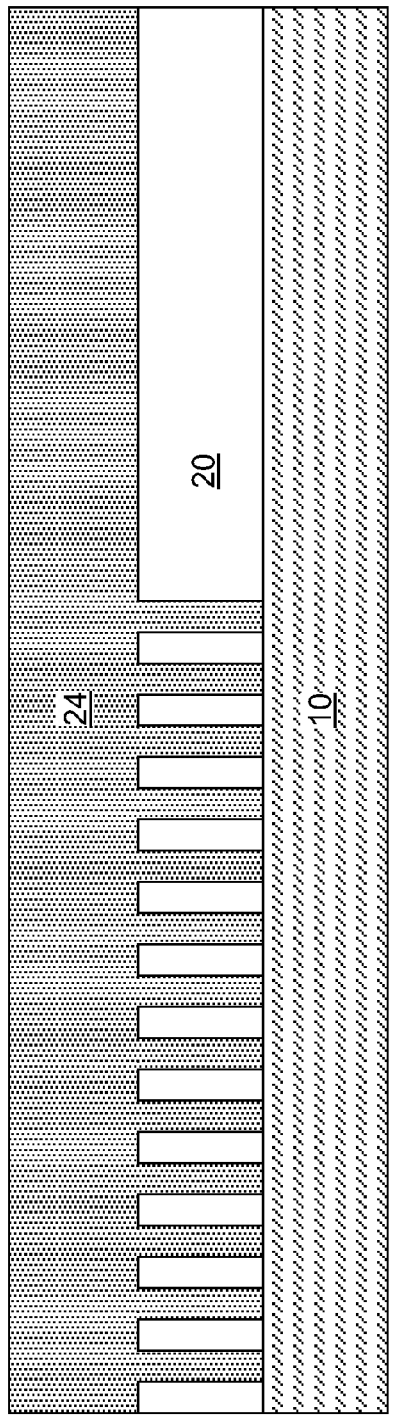
FIG. 15 is a vertical cross-sectional view of the third exemplary structure after forming a dielectric material layer over the patterned underlying material layer according to the third embodiment of the present disclosure.

Referring to FIG. 15, a dielectric material layer 24 can be deposited over the patterned underlying material layer 20 to provide electrical isolation between the various conductive portions of the patterned underlying material layer 20. Optionally, additional conductive structures (not shown) may be formed in an upper portion of the dielectric material layer 24 to provide electrical connections among the various conductive portions of the underlying material layer 20.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of patterning a structure comprising:
    forming a metal nitride layer on a substrate;
    forming a cap material layer having a different composition than said metal nitride layer directly on said metal nitride layer;

forming a stack of an organic planarizing layer (OPL) and an antireflective coating (ARC) layer on said cap material layer;
  forming patterned line structures comprising a dielectric material on said ARC layer;
  simultaneously etching said cap material layer and at least one of said patterned line structures and said ARC layer, wherein a pattern present in said ARC layer is transferred through said OPL and said cap material layer, and a top surfaces of said metal nitride layer is exposed after said simultaneous etching;
  transferring said pattern from said OPL into said metal nitride layer; and
  transferring said pattern from said metal nitride layer into an upper portion of said substrate.

2. The method of claim 1, further comprising:
  forming a second OPL over said patterned line structures;
  applying and patterning a block level photoresist over said second OPL; and
  removing a portion of said second OPL that is not covered by said patterned block level photoresist.

3. The method of claim 2, further comprising forming a second ARC layer on said second OPL, wherein said block level photoresist is applied directly on said second ARC layer.

4. The method of claim 2, further comprising patterning said second OPL by etching exposed portions of said second OPL employing said patterned block level photoresist as an etch mask.

5. The method of claim 1, wherein said metal nitride layer is a TiN layer, a TiW layer, or a WN layer.

6. The method of claim 5, wherein said cap material layer comprises a dielectric material.

7. The method of claim 6, wherein said cap material layer comprises silicon oxide, silicon nitride, silicon carbide, or a combination thereof.

8. The method of claim 1, wherein said metal nitride layer is a TiN layer, and said cap material layer comprises a metallic material different from TiN.

9. A method of patterning a structure comprising:
  forming a metal nitride layer on a substrate;
  forming a cap material layer having a different composition than said metal nitride layer directly on said metal nitride layer;
  forming a stack of an organic planarizing layer (OPL) and an antireflective coating (ARC) layer on said cap material layer;
  forming patterned line structures comprising a dielectric material on said ARC layer;
  etching said cap material layer and at least one of said patterned line structures and said ARC layer employing at least said patterned line structures as an etch mask, wherein a pattern present in said ARC layer is transferred through said OPL and said cap material layer, and a top surfaces of said metal nitride layer is exposed after said etching;
  transferring said pattern from said OPL into said metal nitride layer; and
  transferring said pattern from said metal nitride layer into an upper portion of said substrate.

10. The method of claim 9, further comprising covering portions of said patterned line structures with a patterned second OPL, wherein said OPL is etched employing a combination of said patterned line structures and said patterned second OPL as an etch mask.

11. The method of claim 10, further comprising:
  forming a stack of a blanket OPL, a second ARC layer, and a block level photoresist; and
  patterning said stack, wherein a patterned portion of said blanket OPL is said patterned second OPL.

12. The method of claim 11, wherein said patterned line structures are exposed outside an area of said patterned stack after said patterning of said stack.

13. The method of claim 11, wherein exposed portions of said ARC layer and a remaining portion of said second ARC layer after said patterning of said stack are etched simultaneously in an etch.

14. The method of claim 13, further comprising simultaneously etching said patterned second OPL and portions of said OPL that are not covered by said patterned line structures or said second OPL.

15. A method of patterning a structure comprising:
  forming a metal nitride layer on a substrate;
  forming a cap material layer having a different composition than said metal nitride layer directly on said metal nitride layer;
  forming a stack of an organic planarizing layer (OPL) and an antireflective coating (ARC) layer on said cap material layer;
  forming mandrels having parallel sidewalls on said ARC layer;
  depositing a conformal dielectric layer on said parallel sidewalls and exposed surfaces of said ARC layer;
  anisotropically etching said conformal dielectric layer, wherein remaining portions of said conformal dielectric layer form patterned line structures on said parallel sidewalls of said mandrels;
  etching said cap material layer and at least one of said patterned line structures and said ARC layer, wherein a pattern present in said ARC layer is transferred through said OPL and said cap material layer, and a top surfaces of said metal nitride layer is exposed after said etching;
  transferring said pattern from said OPL into said metal nitride layer; and
  transferring said pattern from said metal nitride layer into an upper portion of said substrate.

16. The method of claim 15, further comprising:
  depositing a mandrel material layer on said ARC layer; and
  patterning said mandrel material layer, wherein patterned portions of said mandrel material layer are said mandrels.

17. The method of claim 15, wherein said mandrels comprise a photoresist or amorphous carbon.

18. The method of claim 15, wherein said conformal dielectric layer is deposited by molecular layer deposition (MLD) in which multiple reactants are alternately provided in a process chamber to deposit said conformal dielectric layer.

19. The method of claim 15, wherein said conformal dielectric layer comprises silicon oxide, silicon nitride, or a combination thereof.

20. The method of claim 15, wherein said mandrels have a lithographic pitch in one direction, and a plurality of said patterned line structures are formed by said anisotropic etching within said lithographic pitch in said direction.

* * * * *